United States Patent [19]

Sajja et al.

[11] Patent Number: 5,400,948
[45] Date of Patent: Mar. 28, 1995

[54] CIRCUIT BOARD FOR HIGH PIN COUNT SURFACE MOUNT PIN GRID ARRAYS

[75] Inventors: Vijay M. Sajja, Fremont; Siamak Jonaidi, San Jose, both of Calif.

[73] Assignee: Aptix Corporation, San Jose, Calif.

[21] Appl. No.: 190,795

[22] Filed: Feb. 2, 1994

Related U.S. Application Data

[62] Division of Ser. No. 947,106, Sep. 18, 1992, Pat. No. 5,313,021.

[51] Int. Cl.[6] .......................... B23K 31/02; H05K 3/34
[52] U.S. Cl. .................. 228/180.1; 228/254; 228/215
[58] Field of Search ............ 228/254, 215, 248.1, 228/180.22, 180.21, 165, 180.1

[56] References Cited

U.S. PATENT DOCUMENTS

| | | | |
|---|---|---|---|
| 3,700,510 | 10/1972 | Keene et al. | 156/652 |
| 4,268,585 | 5/1981 | Daur et al. | 174/261 X |
| 4,418,857 | 12/1983 | Ainslie et al. | 228/124 |
| 4,434,434 | 2/1984 | Bhattacharya et al. | 357/71 |
| 4,661,654 | 4/1987 | Strobel | 174/263 |
| 4,755,631 | 7/1988 | Churchwell et al. | 361/404 X |
| 4,806,706 | 2/1989 | Machida et al. | 174/250 |
| 4,818,728 | 4/1989 | Rai et al. | 228/180.1 X |

*Primary Examiner*—P. Austin Bradley
*Assistant Examiner*—Jeanne M. Elpel
*Attorney, Agent, or Firm*—D'Alessandro, Frazzini & Ritchie

[57] ABSTRACT

A method for fabricating a printed circuit board for high pin count surface mount pin grid arrays is provided where surface mount pads for soldering a surface mount pin grid array package are isolated by solder mask layers. The printed circuit board is laminated with one or more solder mask layers containing apertures therein to expose the surface mount pad locations.

2 Claims, 3 Drawing Sheets

CIRCUIT BOARD FOR HIGH PIN COUNT SURFACE MOUNT PIN GRID ARRAYS

CROSS-REFERENCE TO RELATED APPLICATION

This application is a divisional of United States patent application Ser. No. 07/947,106, filed Sep. 18, 1992, and entitled CIRCUIT BOARD FOR HIGH PIN COUNT SURFACE MOUNT PIN GRID ARRAYS, now U.S. Pat. No. 5,313,021.

BACKGROUND OF THE INVENTION

1. Field Of The Invention

The present invention relates to the manufacture and assembly of circuit boards for high pin count surface-mount pin-grid array integrated circuit packages. More particularly, the present invention relates to the circuit boards having a top surface layer adapted for soldering high pin count packages for high yield assembly operations.

2. The Prior Art

The quad flat package (QFP) is the most popular high pin count integrated circuit package currently in use. QFP's are rectangular in shape and have leads on all four peripheral sides of the package. The number of pins which can be provided on QFP packages depends on both the body size of the package and the pitch of the pins. A few illustrative packages of the QFP family and their associated pin density and pin count include: the QFP package, which is 40 mm$^2$ in size and has either 232 pins at a pitch of 0.65 mm (25 mils), 300 pins at a pitch of 0.5 mm (20 mils), or 380 pins at a pitch of 0.4 mm (15 mils); the PGA package which is 58 mm$^2$ in size, having 432 pins at a pitch of 2.54 mm (100 mils), or 34.5 mm$^2$ in size, having 380 pins at a pitch of 1.27 mm (50 mils); and the SMPGA package, which is 34.5 mm$^2$ in size, having 1024 pins at a pitch of 1 mm (40 mils). Because of the closeness of neighboring pins on these packages, a major drawback is the difficulty in surface mounting these devices. In addition, the pins are also very fragile and are easily bent, thus further complicating assembly processes employing them.

Packages with pin counts greater than 306 tend to be mostly pin grid array (PGA) packages. Most of these PGA packages are mounted to circuit boards using through-hole soldering techniques. A PGA package with pins at a 50 mil pitch has a higher pin density than any of the QFP's. The pin density of PGA packages with pins at 40 mil pitch is 3 times higher than the pin density of QFP's. Employing this type of integrated circuit package thus results in significant savings in circuit board area.

A major problem with soldering a 40 mil pitch through-hole package component is that the printed circuit board is almost impossible to make for this pitch for through-hole soldering. The primary constraint is that large holes (i.e., 20 mil minimum diameter) are required for through-soldering of the packages. A secondary design constraint is the metal trace width and the minimum space between traces. Fine pitch reduces the number of traces between vias, thereby contributing to increased circuit board thickness. The way to overcome these constraints is to use surface mount components such as surface-mount PGA packages. Connecting one layer to another on a surface mount board can be accomplished with vias as small as 10 mils. The smaller via dimensions allow more traces to pass between vias, thus further reducing overall pin pitch.

Printed circuit boards for surface mount pin grid arrays have been manufactured with conventional solder mask over bare copper (SMOBC) technology. Most printed circuit boards for these packages require multiple layers of metallization for routing. Multilayer printed circuit boards are fabricated by first patterning the internal layers on either single sided or double sided copper laminates. These laminates are then stacked with B-stage polymer separating the different layers. The stack is then laminated in a heated press. Holes are drilled and electroless copper plated to provide the interconnection between the different layers. Outerlayers are patterned. The vias and the outerlayers are then plated with electrolytic copper followed by solder. After the outerlayers have been patterned using the solder as a resist, the solder is stripped off. Liquid solder mask is then applied on areas where bonding is not going to be performed. The printed circuit board is then hot-air solder levelled (HASL) to coat the copper on the bonding pads with solder.

When surface mounting a surface mount pin grid array (SMPGA) device, solder paste is screened onto the bond pads. The component is then placed on top of the solder paste and the solder is reflowed. There are several problems with this manufacturing technique. The surface mount pin grid array leads form a butt joint. The strength of a butt joint is proportional to the height of the solder joint. The bond pad for 40 mil pitch and finer pitch pin grid arrays tends to be smaller than 24 mils on a side. In order to obtain a tall joint, a thick stencil capable of dispensing a 10 mil thick or thicker layer of solder paste has to be used. Such a thick layer of solder paste tends to droop and short neighboring pads together. The second problem is that if the via (which connects the pin to the inner layers) is very close, as is the case for these packages, the solder can flow down the via during the reflow operation. This will leave a smaller amount of solder to form the joint, causing, at best, the formation of a weak and unreliable joint and, at worst, an open solder joint.

BRIEF DESCRIPTION OF THE INVENTION

According to a first aspect of the present invention, a printed circuit board includes a plurality of conductive pads provided on at least one face thereof for attaching components. One or more layers of solder mask material are provided on the face of the printed circuit board between the attachment pads forming wells surrounding the pads. The wells create cavities into which solder paste can be dispensed. Once in the well, the solder paste cannot slump, migrate, or smear to create short circuits.

According to a second aspect of the invention, the height of the wells can be selected to define the volume of the wells. The well volume will define the volume of solder dispensed and hence the height of the solder joint. The well also allows the manual placement of the SMPGA onto these pads.

The pad itself is designed to maximize the size of the pad. The pad is not hot air solder levelled. Not hot air solder levelling the pad leaves the pad flat and allows all of the component leads to be on the same plane.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

The surface-mount pin-grid array printed circuit board of the present invention is now described in further detail with reference to the drawings which illustrate various embodiments within the scope of the invention.

Figure 1:
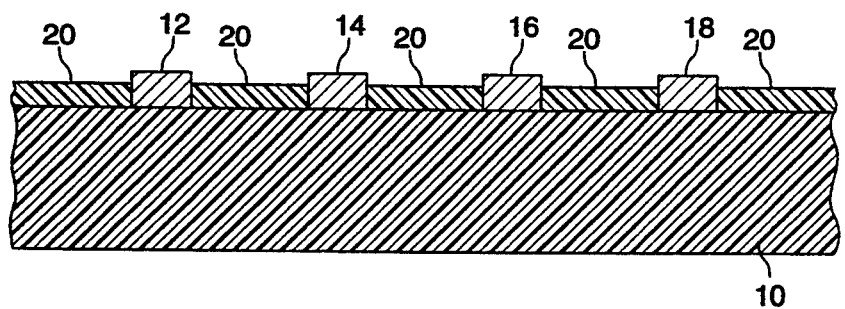
FIG. 1 is a cross sectional view of a typical prior art printed circuit board taken through a number of component-attachment pads.

Referring first to FIG. 1, a cross-sectional view diagram shows a typical prior art arrangement wherein printed circuit board 10 is shown including a plurality of surface-mount component-attachment pads 12, 14, 16, and 18, which are formed using conventional printed circuit technology. Printed circuit board 10 may be formed from conventional materials, such as FR-4, kevlar, polyimide, BT or other materials known in the art. Surface-mount component-attachment pads 12, 14, 16, and 18 are typically formed from a material such as copper, and may typically have a thickness of about 0.001". The pads are connected to various conductive traces (not shown) within printed circuit board 10 which are used to route electrical signals to and from them.

A layer of solder mask material 20 is disposed on the surface of printed circuit board 10 in between surface-mount component-attachment pads 12, 14, 16, and 18. Solder mask material 20 may comprise one of a number of the mask materials commonly available, such as Riston solder mask material made by DuPont, Conformask solder mask material of Dynachem or other material as is known in the art. In a typical prior-art embodiment, the layer of solder mask material 20 has a thickness of between about 0.0005" and 0.001".

As previously mentioned, there are several problems with the conventional SMOBC technology manufacturing technique. In order to obtain a tall and strong solder joint, a thick solder-paste stencil has to be used, which tends to droop and short neighboring pads together. In addition, solder can flow down closely spaced vias during the reflow operation, leaving a smaller amount of solder to form the joint, causing, at best, the formation of a weak and unreliable joint and, at worst, an open solder joint.

Figure 2:
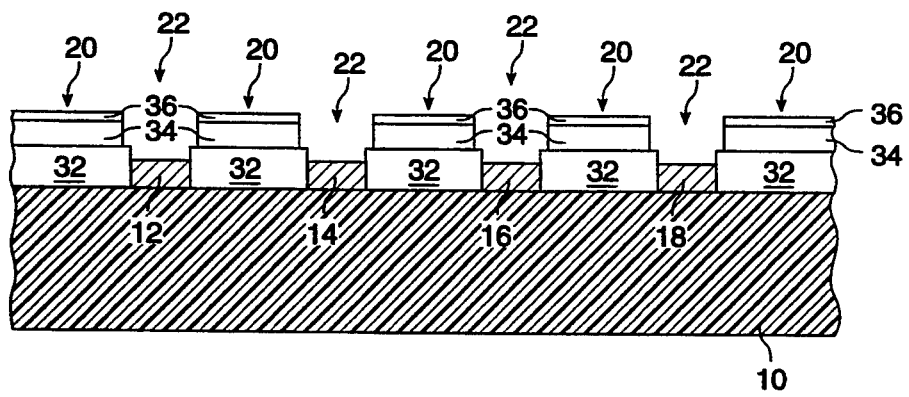
FIG. 2 is a cross sectional view of a printed circuit board according to a presently preferred embodiment of the invention taken through a number of component-attachment pads.

Referring now to FIG. 2, a cross sectional view of a printed circuit board according to a presently preferred embodiment of the invention taken through a number of component-attachment pads is presented. The embodiment of the present invention depicted in FIG. 2 is also formed on printed circuit board 10, and includes a plurality of surface-mount component-attachment pads 12, 14, 16, and 18. The regions between surface-mount component-attachment pads 12, 14, 16, and 18 are occupied by a layer of solder mask material 20 disposed on the surface of printed circuit board 10. Solder mask material 20 may comprise one of the known materials.

The relative thicknesses of the surface-mount component-attachment pads 12, 14, 16, and 18, and the layer of solder mask material 20 are such that wells 22 are formed by the vertical walls of the solder mask material, with surface-mount component-attachment pads 12, 14, 16, and 18 disposed at the bottoms of the wells. In a typical embodiment of the present invention, surface-mount component-attachment pads 12, 14, 16, and 18 may comprise a 0.001" thick layer of copper, and solder mask material 20 may have a thickness of between about 0.004" and 0.012", preferably about 0.008". In such an embodiment, wells 22 have a nominal depth of about 0.007".

Figure 3:
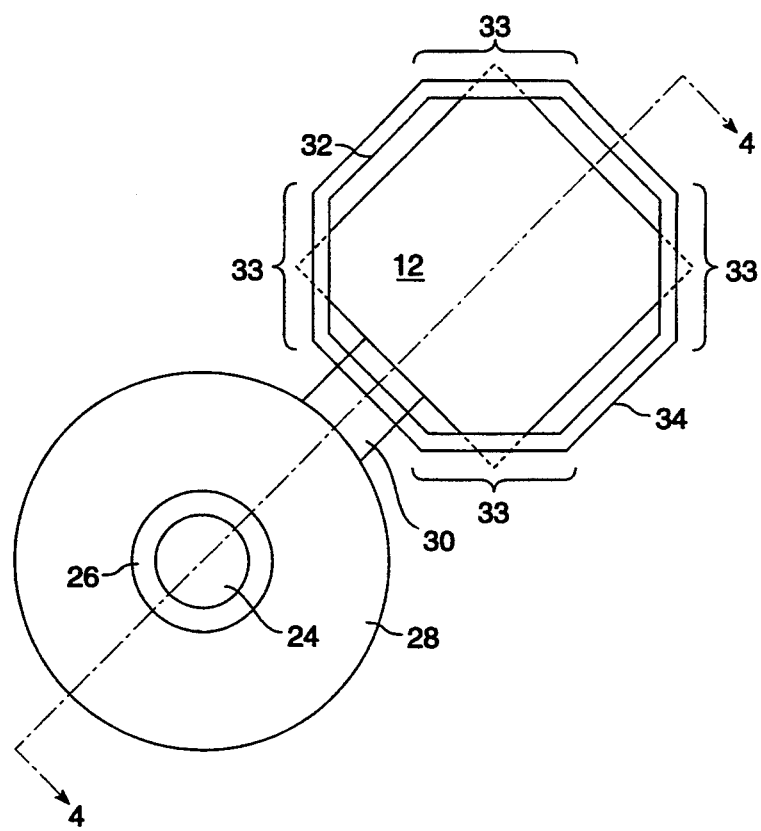
FIG. 3 is a top view of a printed circuit board according to the present invention showing a magnified view of the surface-mount component-attachment pads to which the pins of the surface mount components will be soldered and a corresponding via connected by a conducting trace.

Referring now to FIG. 3, a top view of a portion of the printed circuit board 10 of FIG. 2 is presented. FIG. 3 includes a magnified view of one of the surface-mount component-attachment pads 12 to which the pins of the surface mount components will be soldered. Surface-mount component-attachment pad 12 is generally rectilinear or square in shape and, according to a presently preferred embodiment of the invention, may be about 24 mils square. Those of ordinary skill in the art will recognize that component-attachment pads 12 may assume other shapes. For instance, the pads may be circular or octagonal. FIG. 3 also illustrates a via hole 24 and its associated metal plate-through layer 26 and cover pad 28 connected to surface-mount component-attachment pad 12 via a conductive trace 30. A narrow 4 rail wide trace has been used in an actual embodiment as this is the current manufacturing limit.

Figure 4:
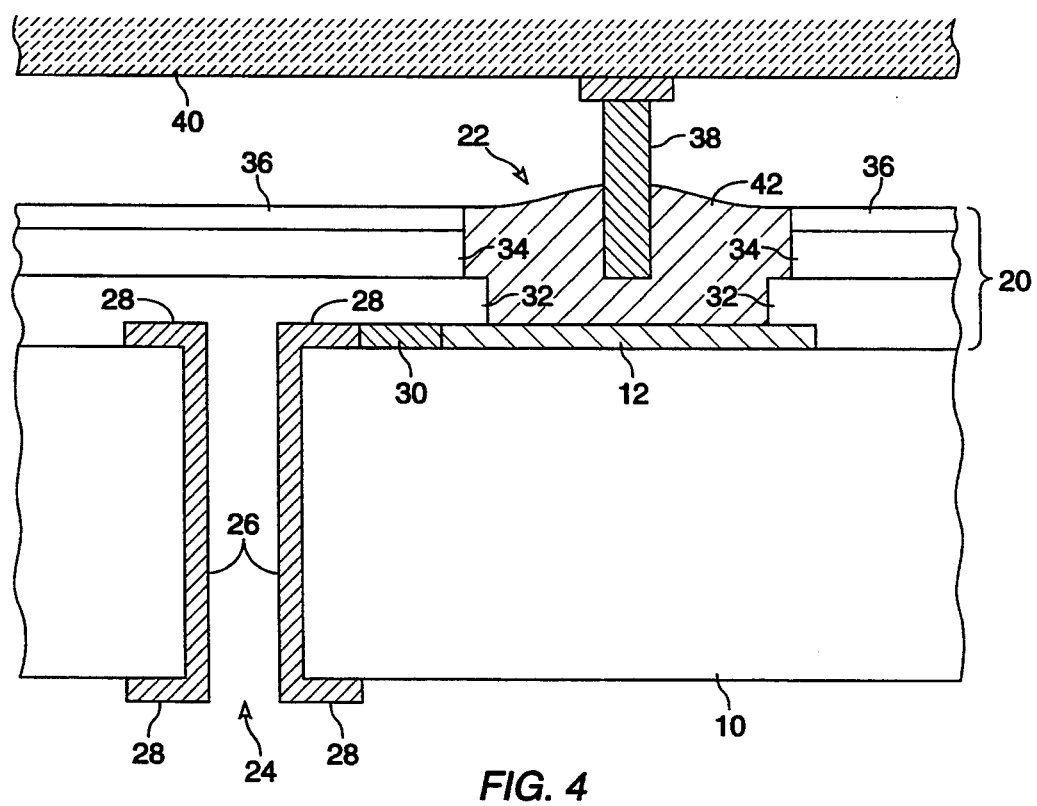
FIG. 4 is cross-sectional view of a portion of the printed circuit board of FIG. 3 in the vicinity of a surface mount pad, including a single pin from a pin grid array package soldered to the surface mount pad.

Finally, a presently-preferred multilayer structure for the solder mask 20 is depicted in FIG. 4. It may be seen that solder mask 20 is a multilayer structure. A first solder mask layer 32 having a 26 mil square aperture substantially centered over the pad 12 is formed on the surface of printed circuit board 10. A second layer 34 having a 30 mil square aperture substantially centered over the pad 12 is formed on the surface of first solder mask layer 32 having a 30 mil square aperture. A third layer 36 (seen only in FIG. 4) having a 30 mil square aperture substantially centered over the pad 12 is formed on the surface of second solder mask layer 34 having a 30 mil square aperture. All of the apertures in the solder mask layers preferably have chamfered corners 33 as shown in FIG. 3. The purpose of the chamfers is to assure separation between closely-packed pads by eliminating the tips of the apertures which would otherwise extend towards one another and bring adjacent apertures closer together. The solder mask layers 32, 34, and 36 may comprise 0.002", 0.004" and 0.004" of Conformask solder mask material available from Dynachem Corporation of Los Angeles, Calif. Those of ordinary skill in the art will recognize that, like pads 12, the apertures in the solder masks may assume shapes other than squares.

The apertures can be made larger than the pads themselves as long as other design factors, such as the tenting of holes and the avoidance of overlap of adjacent pads are met. When the apertures are larger than the pads, the space between the edge of the pad and the edge of the aperture should not be large enough to allow penetration of the space by the pin of the integrated circuit device to be mounted to the pad. For example, if the pad is 24 mils square and the opening is 30 mils square, in the worst case if the pad and the aperture are not concentric, there can be a 6 mil gap between the two. If the pin diameter is 8 mils, the pin will not be pushed into this space.

Referring now to FIG. 4, a cross sectional view of the portion of printed circuit board 10 is shown as a cross section taken through lines 4—4 of FIG. 3. A pin 38 of a PGA integrated circuit package 40 is shown connected to pad 12 by a solder mass 42 disposed in well 22. In addition, as known in the art, several conductive traces in interior layers in printed circuit board 10 are shown connected to the plate-through metal coating 26 in via hole 24.

Those of ordinary skill in the art will recognize that the dimensions called out herein have been optimized for currently-available technology and that pads 12 can be made larger as the printed circuit board manufacturing technology improves, in particular, as the diameter of via hole 24 shrinks and as the metal line widths and solder mask tolerances decrease.

To fabricate the printed circuit board of FIGS. 2–4, the inner layers may be laminated and pressed together using prior art multilayer printed circuit board fabrication techniques. After the surface layer has been patterned, instead of applying a liquid solder mask as in prior-art circuit board fabrication processes, a lamination comprising several layers of dry film solder mask material is formed. In the embodiment depicted in FIG. 3, first solder mask layer 32 is placed on the surface of the printed circuit board and then patterned to expose the copper pads. Next, second and third solder mask layers 34 and 36 are placed on the surface of the first solder mask layer 34 and then patterned to again expose the copper pads. The procedures for placing and patterning the solder mask layers 32, 34, and 36 are well known.

The total height of the solder mask used in any actual embodiment of the present invention will depend on the coplanarity of the pins and circuit board to which the pins are being joined. As an example, the embodiment of the present invention depicted in FIGS. 3 and 4 may be used with SMPGA packages having a pin planarity of 4 mils and a printed circuit board planarity of 4 mils. When the co-planarity of the pins and the circuit board are lower, i.e., about 2 mils each, the solder mask can be thinner, i.e. about 6 mils. The upper limit of solder mask thickness should be about 12 mils. When the solder mask is thicker than 0.012", it is very difficult to see the solder joints.

After the solder mask layers are in place, some of the copper pads are then masked, preferably with a Kapton polyimide tape or similar masking substance. The board is then hot-air solder levelled to cover the other bonding pads with solder. The mask is then peeled from the areas of the masked copper pads, and a thin coating of an anti-tarnish material such as benzo-triazole is deposited on the copper pads by a dip coating process. This prevents the copper from being oxidized.

The current trend of integrated circuits is towards high density arrays of input/output pads on a single chip or a multichip substrate. Surface mount pin grid array packages provide the highest density of pins. Currently, these packages are not being used extensively, primarily because all the solder joints cannot be inspected easily. However, if the printed circuit board of the present invention is used, inspection of all of the joints will not be necessary.

Figure 5:
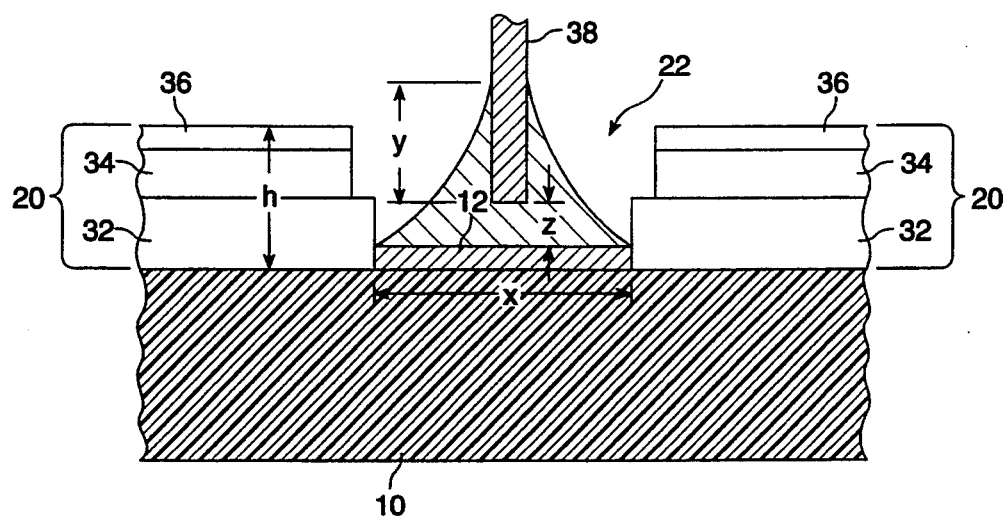
FIG. 5 is a magnified view of a portion of the cross sectional view of FIG. 4, illustrating how to determine the amount of solder paste to be applied when mounting surface mount components to the printed circuit board of the present invention.

The printed circuit board of the present invention makes it possible to achieve high yields. Referring now to FIG. 5, the volume of the solder paste required for soldering can be accurately controlled. FIG. 5 is a magnified view of a portion of the cross sectional view of FIG. 4, showing pad 12 disposed on printed circuit board 10 in well 22 formed by the sidewalls of the aperture in solder mask 20. Pin 38 of a PGA integrated circuit device is shown positioned over the well 22. The width of the pad opening is denoted by X, the height of the solder mask is denoted by h, the height of the solder joint which is the height of the bottom of the pin 38 to the end of the solder meniscus on pin 38 is denoted by Y and the coplanarity of pin 38 to the printed circuit board 10 is denoted by Z. For a reliable joint, the height of every solder joint of the integrated circuit should vary from a minimum of 5 mils to a maximum of 12 mils.

The solder volume to form the solder joint is defined by the dimensions X and h and a factor which is a ratio of the volume of the solder in the paste to the volume of the solder paste. For a given volume of solder paste, Y will be small if Z of the pin is high and vice versa. Using the Laplace equation of capillarity, knowing Z and Y, the volume of the solder paste can be calculated precisely. The pad aperture X is designed based on the allowable tolerances of the manufacturer. Knowing X, the required height h of the solder mask can be calculated.

One advantage of the present invention is that, by defining the size of the pad opening X, and the height of the solder mask h, the volume of the solder paste required for soldering can be accurately controlled. Well 22 in the solder mask 20 helps to prevent the migration of solder from one pad to another. This virtually eliminates rejection of the printed circuit board assembly due to shorts between adjacent pins.

Another advantage of the printed circuit board of the present invention is that the openings in the solder mask allow the device to be placed on the printed circuit board manually without the aid of sophisticated vision equipment. The ease of component placement while using the printed circuit board of the present invention is illustrated with reference to FIG. 6, a perspective view of the printed circuit board of the present invention and a PGA integrated circuit component to be mounted thereon.

Figure 6:
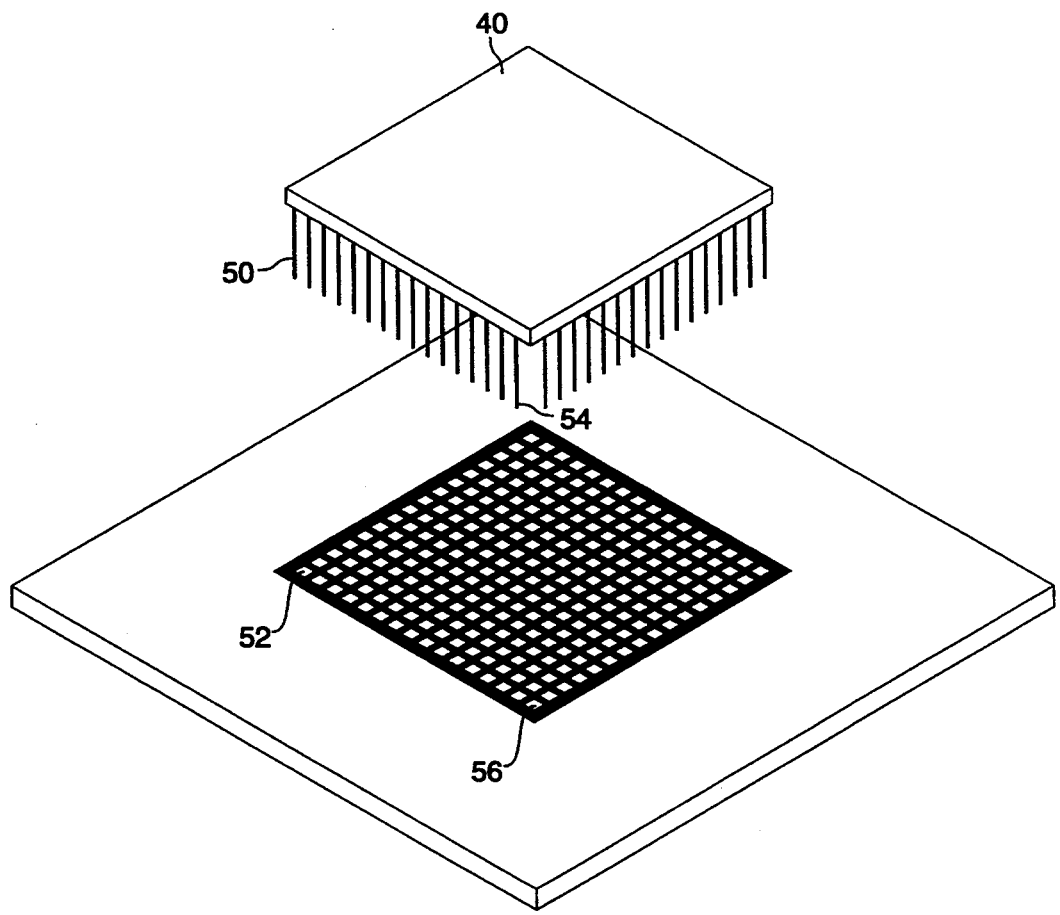
FIG. 6 is a perspective view of the printed circuit board of the present invention showing the ease of mounting components thereon.

Referring now to FIG. 6, manual placement is done by first placing corner pin 50 of package 40 in corner well 52. A determination that the pin is in the well may be easily made by moving the pin around. The presence of an obstruction indicates that pin 50 is in the well 52. The pin on the opposite corner in the same row or column of pins, shown at reference numeral 54 in FIG. 6, is then placed into its mating well 56. The remaining pins are lowered and will automatically fall into the remaining wells. After the package 40 is initially placed such that the pins are aligned in the wells, some pressure is applied to the top of the package to allow all of the pins to penetrate the solder paste. When the pins are all located in the wells, the solder mask prevents the pins from moving out of the cavity by providing a physical barrier. This can be verified by applying gentle lateral motion to the package. After the placement of the components on to the printed circuit board, the printed circuit boards with the mounted components can be transported from the placement area to the reflow machine without any chance that the PGA package 40 will be knocked out of alignment.

The copper pads on the printed circuit board 10 should be planar. Pursuant to prior art processes, these pads are typically hot air solder levelled after the openings in the solder mask have been made. Hot air solder levelling is an uncontrolled process and can result in substantial non-planarity of the pads. It should therefore be avoided when using the printed circuit board of the present invention. The easiest way to achieve planarity of the pads is to avoid any further processing after the wells 20 in the solder mask 22 have been opened. As previously mentioned, oxidation of the copper surfaces of these pads can be prevented by coating the pads with an anti-oxidant such as benzo-triazole. A slightly more expensive alternative is to deposit a very thin coating of electroless gold or palladium or a thick coating of electroless tin on the surfaces of the pads. Yet another way to prevent the oxidation of the copper pads is by sealing them in nitrogen purged bags until ready for assembly.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method of soldering a surface mount pin grid array integrated circuit package having a plurality of pins arrayed in a pattern to a first surface of a printed circuit board having a plurality of conductive pads arrayed thereon in a mating pattern, said method comprising the steps of:
   a. placing a first solder mask layer on the first surface of the printed circuit board;
   b. patterning said first solder mask layer to expose the pads;
   c. placing a second solder mask layer over said first solder mask layer;
   d. patterning said second solder mask layer to expose the pads;
   e. placing a third solder mask layer over said second solder mask layer;
   f. patterning said third solder mask layer to expose the pads;
   g. limiting the total thickness of the combined first solder mask layer, second solder mask layer and third solder mask layer to a range of between 4 and 12 mils;
   h. masking the pads;
   i. hot-air solder levelling the printed circuit board;
   j. unmasking the pads;
   k. coating the pads with an anti-tarnish agent;
   l. placing a predetermined amount of solder paste over each pad in wells formed thereover by said first solder mask, said second solder mask and said third solder mask;
   m. placing the surface mount pin grid array integrated circuit package pins into their respective wells of the printed circuit board to form a pre-solder assembly;
   n. applying a downward pressure on the surface mount pin grid array integrated circuit package with respect to the printed circuit board;
   o. heating said pre-solder assembly to a temperature sufficient to melt said solder paste to form a post-solder assembly; and
   p. cooling said post-solder assembly.

2. The method according to claim 1 wherein step (b) creates a plurality of first apertures each having a first cross-sectional area in said first solder mask layer and step (d) creates a plurality of second apertures each having a second cross-sectional area in said second solder mask layer, said second cross-sectional area having a greater magnitude than said first cross-sectional area.

* * * * *